(12) United States Patent
Tapadia et al.

(10) Patent No.: US 9,780,644 B1
(45) Date of Patent: Oct. 3, 2017

(54) METHODS AND APPARATUS FOR ALWAYS ON DOMAIN FINITE STATE MACHINE SHUTDOWN USING A CLOCK SOURCE FROM A POWER MANAGED DOMAIN

(71) Applicants: Texas Instruments Incorporated, Dallas, TX (US); Texas Instruments Deutschland GMBH, Freising (DE)

(72) Inventors: Swapnil Anilkumar Tapadia, Bangalore (IN); Bernd Schneider, Freising (DE)

(73) Assignees: TEXAS INSTRUMENTS INCORPORATED, Dallas, TX (US); TEXAS INSTRUMENTS DEUTSCHLAND GMBH, Freising (DE)

( * ) Notice: Subject to any disclaimer, the term of this patent is extended or adjusted under 35 U.S.C. 154(b) by 0 days.

(21) Appl. No.: 15/220,092

(22) Filed: Jul. 26, 2016

(51) Int. Cl.
*G05F 1/10* (2006.01)
*H02M 1/36* (2007.01)

(52) U.S. Cl.
CPC ..................................... *H02M 1/36* (2013.01)

(58) Field of Classification Search
CPC ............. G06F 1/266; G06F 1/26; H04L 67/12
See application file for complete search history.

(56) References Cited

U.S. PATENT DOCUMENTS

| 7,840,239 B2 | 11/2010 | Indiani et al. | |
|---|---|---|---|
| 2013/0124895 A1* | 5/2013 | Saha | G06F 1/26 713/323 |

* cited by examiner

*Primary Examiner* — Sibin Chen
(74) *Attorney, Agent, or Firm* — John R. Pessetto; Charles A. Brill; Frank D. Cimino

(57) ABSTRACT

An apparatus includes: a voltage regulator that outputs a voltage responsive to an enable signal; a power managed domain coupled to the voltage regulator and including a clock generator configured to output a clock signal from the clock generator; and an always on domain. The always on domain receives the clock signal. The always on domain includes a finite state machine coupled to receive the clock signal and receiving a shutdown request signal. The finite state machine is configured to output a signal to control power to the power managed domain and to disable the clock generator, responsive to the shutdown request signal. The finite state machine receives an asynchronous wake signal, and circuitry in the always on domain is coupled to enable power to the power managed domain and to the clock generator, responsive to the asynchronous wake input signal.

20 Claims, 6 Drawing Sheets

METHODS AND APPARATUS FOR ALWAYS ON DOMAIN FINITE STATE MACHINE SHUTDOWN USING A CLOCK SOURCE FROM A POWER MANAGED DOMAIN

TECHNICAL FIELD

This application relates in general to distributed power management, and more particularly to a reduced power always on domain controlling a power managed domain.

BACKGROUND

Distributed power management is a key technology enabling portable battery powered devices. Power management enables increased run time, reduction in battery size, lower heat dissipation, and lower device weight. Prior power management techniques centered on a central power management circuit. The power management circuit or power control module is located on a circuit board or in the system that gates power to various circuits in the system. The single power management controller ensured the various circuits would power back up in phase with the primary controller or system clock.

As integrated circuits have grown in complexity and are increasingly used for battery powered devices where available power is limited, distributed power management is increasingly used to extend battery life and reduce power consumption. In co-owned U.S. Pat. No. 7,840,239, entitled "DISTRIBUTED POWER MANAGEMENT", issued Nov. 23, 2010 to inventors Indiani et. al., which is hereby incorporated by reference in its entirety herein, a power controller is disclosed that digitally sends a power down message to various sub-circuits.

With continuingly increasing device integration and as the number of devices within ICs increases, in-circuit power down techniques have developed. In these prior known approaches, various circuit sub-systems are identified and grouped into various power domains within the integrated circuit. The different power domains can be powered down when the sub-systems that are within the power domains are not in use. In a known approach, to enact the power down sequence, a finite state machine (FSM) controls a power down sequence for the various power managed domains. The FSM is placed in an always on domain (AOD) where a clock supplying the FSM is maintained so that the power down and wake-up will occur synchronously with the system clock. Other than receiving the clock pulses, the FSM is only active when a power down request is received or a wake-up is needed. In an ideal situation, only the FSM circuitry is included in the AOD. The overall power consumption of the integrated circuit device is reduced because during shutdown or sleep modes only the FSM is active. In practical integrated circuits, various functions that cannot be powered down, such as interrupt handlers, input/output controllers, and activity timers are included in the AOD along with the power down FSM.

At least two prior approaches have been used to further manage power consumption within the AOD. For a very low power approach, a very slow clock can be used within the AOD that is a multiple of a main clock. Because the power consumption in a conventional logic integrated circuit scales in proportion to clock frequency, the use of the slow running clock will lower power consumption. However, in the slow clock approach the integrated circuit or system including the FSM also has a slow wake-up time, and a slow response after a wake-up event. Another known approach is to run a faster clock that uses more power within the AOD, but that will result in an improved wake-up time. The higher power consumption can be reduced somewhat by gating the clock (thereby emulating a slower clock) during power down times; however, even with the use of the gated clock there will still be leakage power loss as the clock generating circuitry is still powered.

SUMMARY

In an example embodiment, an apparatus includes: a voltage regulator that outputs a voltage responsive to an enable signal; a power managed domain coupled to the voltage from the voltage regulator and including a clock generator configured to output a clock signal from the clock generator; and an always on domain. The always on domain is coupled to receive the clock signal from the power managed domain. The always on domain further includes: a finite state machine coupled to receive the clock signal and to receive a shutdown request signal. The finite state machine outputs a signal to control the power to the power managed domain and to disable the clock generator, responsive to the shutdown request signal. The always on domain also includes an asynchronous wake input arranged to receive an asynchronous wake signal, and further includes circuitry in coupled to enable power to the power managed domain, responsive to the asynchronous wake input signal.

DETAILED DESCRIPTION OF EXAMPLE EMBODIMENTS

Corresponding numerals and symbols in the different figures generally refer to corresponding parts unless otherwise indicated. The figures are not necessarily drawn to scale. The term "coupled" may include connections made with intervening elements, and additional elements and various connections may exist between any elements that are "coupled."

In power domain partitioned devices, the need for a rapid wake-up time after a shutdown or reduced power mode is in opposition to the need for low quiescent current. This tension is especially significant in circuits used in battery powered applications.

In an embodiment, a circuit provides an always on domain and a power managed domain (PD) having both a rapid wake-up time and a low quiescent current. The embodiment eliminates the clock from the always on domain (AOD)

during the shutdown sequence. In the embodiments, a finite state machine (FSM) uses the same clock as the PD that is being managed to synchronously shut down the PD. To wake-up the PD after shutdown, an asynchronous power up signal enables power to the power managed domain, restarting the PD clock. After a delay time for the PD clock to become stable, the FSM then uses the PD clock to synchronously wake-up the PD. By eliminating the clock and the associated clock generation circuitry from the AOD, and by stopping the clock in sleep or shutdown modes, power consumption in the embodiment circuits is reduced beyond the power reductions available using prior known approaches.

Figure 1:
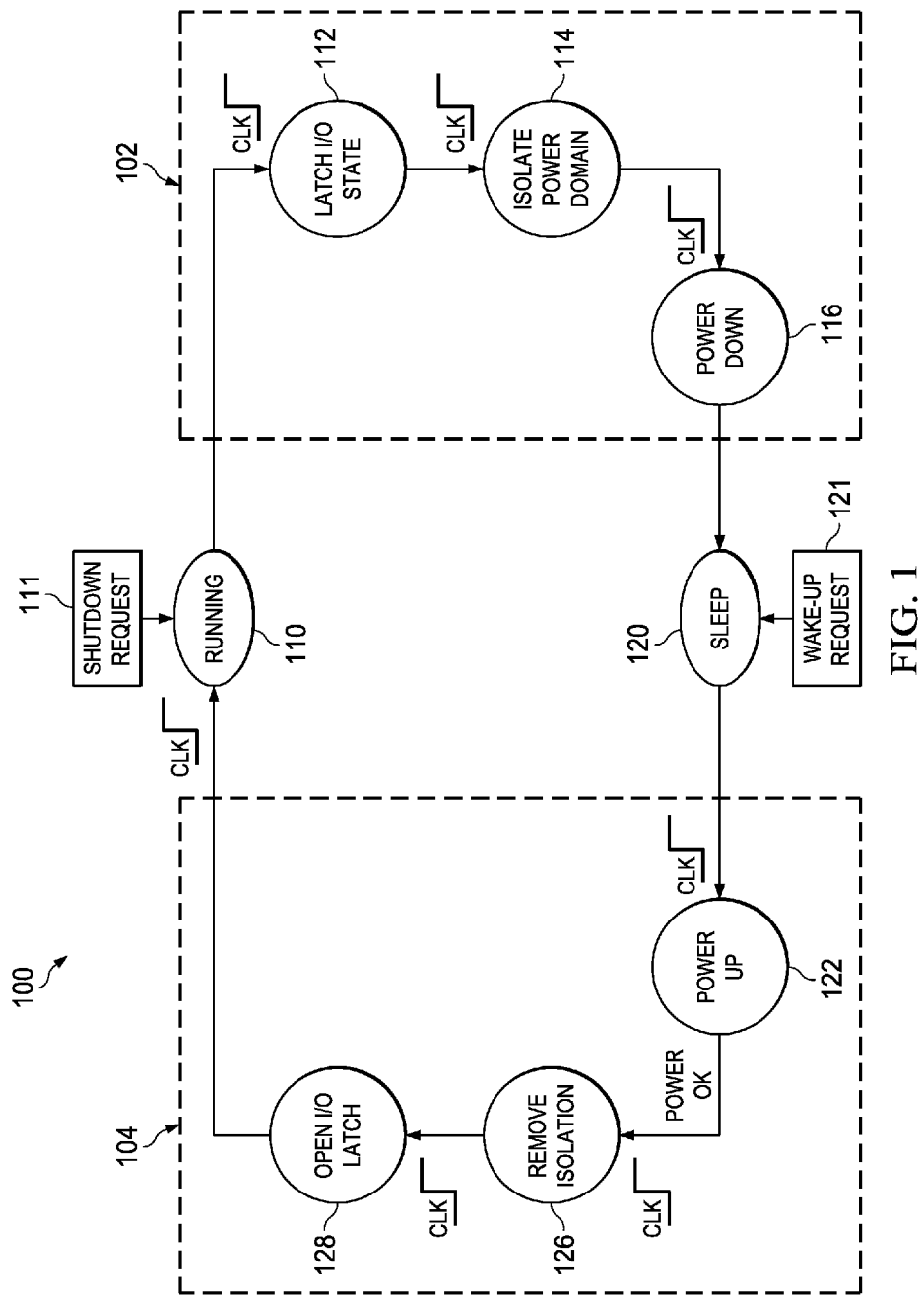
FIG. 1 illustrates in a state diagram a conventionally clocked finite state machine for providing a power managed domain shutdown and wake-up process.

FIG. 1 illustrates in a state diagram 100 the states for a conventionally clocked FSM. The FSM controls a power managed domain shutdown and wake-up sequences. There are two sides shown in the state diagram 100. They are the shutdown process in dashed box 102 including states 112, 114, 116 and the wake-up process in dashed box 104 including states 122, 126 and 128. In between these two processes are two stable states, the "Running" state 110 at the top and the "Sleep" state 120 at the bottom. Beginning in state 110, Running, and progressing clockwise around the state diagram of FIG. 1, the next action is to transit to state 112 after receiving a shutdown request 111 for the PD. At state 112, the "Latch I/O state", the FSM, which is located within the AOD, sends a signal on the rising edge of a clock to cause the PD to latch or retain the critical inputs and outputs of the PD. These I/O signals are signals that interface with an external system. For example, the PD may be controlling the master/slave mode of an external communication device like a Serial Peripheral Interface (SPI) device. Other external signals can include general-purpose I/O (GPIO) signals. The "retain" action of the Latch I/O state 112 preserves the I/O states of the PD circuitry. The FSM then transitions to the next state 114, the "Isolate power domain" state. In state 114, the FSM sends a signal to isolate the AOD inputs that are driven from the PD on the rising edge of the clock signal CLK. The Isolate power domain state isolates the AOD inputs driven from the PD to make sure that powering down the PD will not have an adverse impact on the AOD due to floating inputs. The FSM then transitions to state 116, the "Power down" state. At state 116, the FSM issues a power down signal on a rising clock edge to stop the power to the PD. At this time, the FSM transitions to the sleep state 120. The circuitry in the PD is now shut down, and without power.

In FIG. 1, while the FSM is in the sleep state 120, a clock within the AOD continues to toggle so that the FSM will be ready to receive a wake-up request input signal. The continuous clock running in the AOD causes power consumption in the sleep mode. Because logic circuits implemented in typical semiconductor devices have power consumption that scales directly with the clock frequency, the continuously running clock causes switching power to be consumed. To lower power consumption, the clock can be divided from the system clock, such as system clock divided by sixty-four. However, when the frequency of the FSM clock is reduced, the wake up response time is also delayed.

In the state diagram 100, moving clockwise from the sleep state 120, the FSM transitions to state 122 when an asynchronous signal 121 "Wake-up Request" is received. The wake up request comes from other circuitry within the AOD, or outside of the AOD, or otherwise outside of the PD. The asynchronous wake-up request is synchronized in the AOD domain to the AOD clock. The FSM then issues a signal on the next rising clock edge to enter state 122, the "Power Up" state. Power is then enabled to the PD. Following the receipt of a handshake signal "Power OK" indicating that the power in the PD is OK, the FSM next transitions to state 126, "Remove Isolation". In state 126, on a rising clock edge, the FSM removes AOD input isolation signals, which are driven from the PD. The FSM then transitions to state 128, "Open I/O Latch". In state 128, the FSM signals the PD to open the I/O latches on a rising clock edge. Providing the continuous clock within the AOD, and running the FSM on this clock, ensures the wake-up operation is synchronous. At this point, the FSM transitions back to state 110, Running, where it is ready to re-enter the shutdown sequence again.

Figure 2:
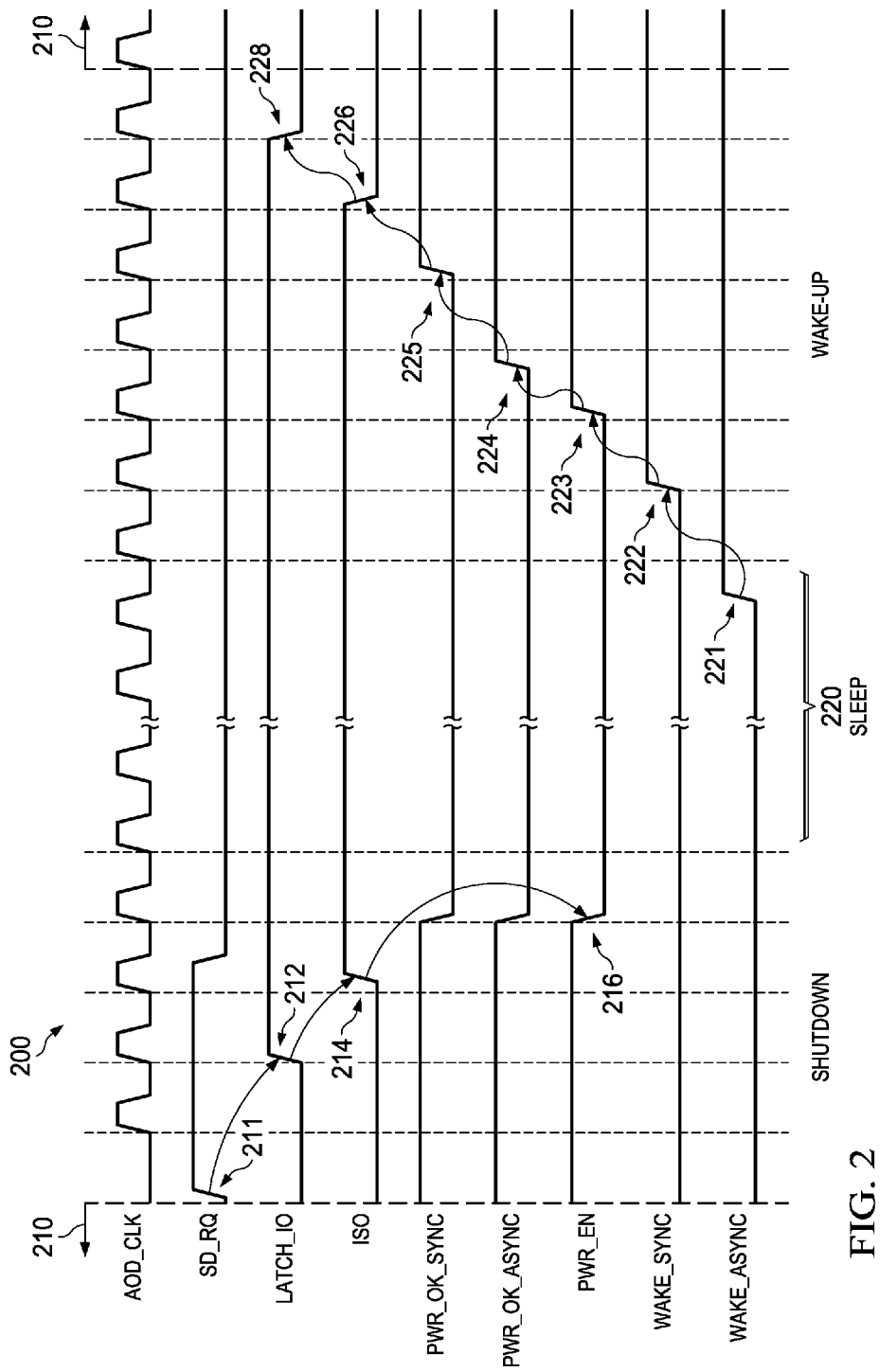
FIG. 2 illustrates in a timing diagram the timing of signals for a power managed domain shutdown and wake-up using an always on clock.

FIG. 2 illustrates a timing diagram 200 for a power domain shutdown and wake-up operation in a conventional approach, such as one using the state diagram of FIG. 1. In FIG. 2, time increases from left to right along the horizontal axis. In the conventional approach, the FSM uses a continuous clock in the always on domain, the AOD_CLK signal. Starting at the top of FIG. 2 and moving down, timing diagram 200 shows several signals: AOD_CLK (always on domain clock), SD_RQ (shutdown request), LATCH_IO (latch I/O signals), ISO (isolate), PWR_OK_SYNC (power OK synchronous), PWR_OK_ASYNC (power OK asynchronous), PWR_EN (power enable), WAKE_SYNC (wake-up synchronous) and WAKE_ASYNC (wake-up asynchronous). All of the signals start disabled (low) at the left side of the timing diagram 200 except: PWR_OK_SYNC; PWR_OK_ASYNC; and PWR_EN.

Starting on the left side of the timing diagram 200, the PD is in a stable and running state at time 210. During the running state, power is enabled to the PD, as indicated by signal PWR_EN being high. The shutdown request signal SD_RQ is asynchronously pulsed high at time 211. On the next rising edge of AOD_CLK, the LATCH_IO signal goes high at time 212. In response to the LATCH_IO signal, the PD will latch the state of the input and output pins, preserving the I/O states. On a following AOD_CLK cycle, the ISO signal goes high at time 214. In response to the ISO signal, the AOD circuit will isolate inputs driven from the PD. At time 216, following the next AOD_CLK cycle, three signals go inactive: PWR_OK_SYNC, PWR_OK_ASYNC and PWR_EN. These inactive signals indicate that the power to the PD is to be stopped, starting the shutdown or sleep mode (indicated as period 220) for the PD. At the top of FIG. 2, the signal AOD_CLK is shown continuing to toggle during the sleep period 220. The break symbols in the data traces in FIG. 2 indicate that the sleep mode in period 220 can extend for many clock cycles, and is of indeterminate length.

A wake-up sequence begins with an active signal WAKE_ASYNC. A rising edge of WAKE_ASYNC is active at time 221. WAKE_SYNC is synchronized with AOD_CLK, and goes active at time 222. Following a subsequent clock edge on the AOD_CLK signal, the PWR_EN signal goes active at time 223, turning power on to the PD.

The handshake signal PWR_OK_ASYNC goes active at time 224, indicating that the PD power up is successful. The next handshake signal PWR_OK_SYNC goes active at time 225 following the next rising clock edge, indicating that the power in the PD is stable. The next event at time 226 in the wake up sequence is the input isolation signal ISO going inactive, enabling the PD inputs to AOD. The next step in the wake-up sequence at time 228 is the LATCH_IO line going inactive, releasing the external input outputs of the PD to toggle. At this time, the PD is running normally, returning to the running state indicated as 210 at the right side of the timing diagram. In the operation of the FSM described hereinabove, the FSM is located within the AOD and clocked with the AOD_CLK signal that runs continuously. The clock to the FSM continues to run and cause power consumption during the SLEEP mode for the PD.

In an example embodiment, in a system with a power managed domain and an always on domain, the AOD is provided without an internal clock. An FSM in the AOD is operated on the clock received from the PD that is being controlled. This clock is used to sequence the PD into sleep mode and back to running mode. In the embodiments, the clock tree within the PD is arranged so that the PD clock can be isolated independently from the rest of the circuitry in the PD. With the PD clock isolated from the other signals, the FSM in the AOD can use the clock from the PD. The absence of a clock toggling within the AOD during shutdown modes reduces power consumption. An asynchronous wake up signal to the AOD results in power being asynchronously restored to the PD clock circuitry. By not having a continuously running clock during sleep or shutdown modes, and by using the clock from the PD to clock the FSM that controls the shutdown and wakeup sequences, systems and devices can be implemented with power management that provides very low power consumption, and that also provides fast recovery from a sleep mode.

Figure 3:
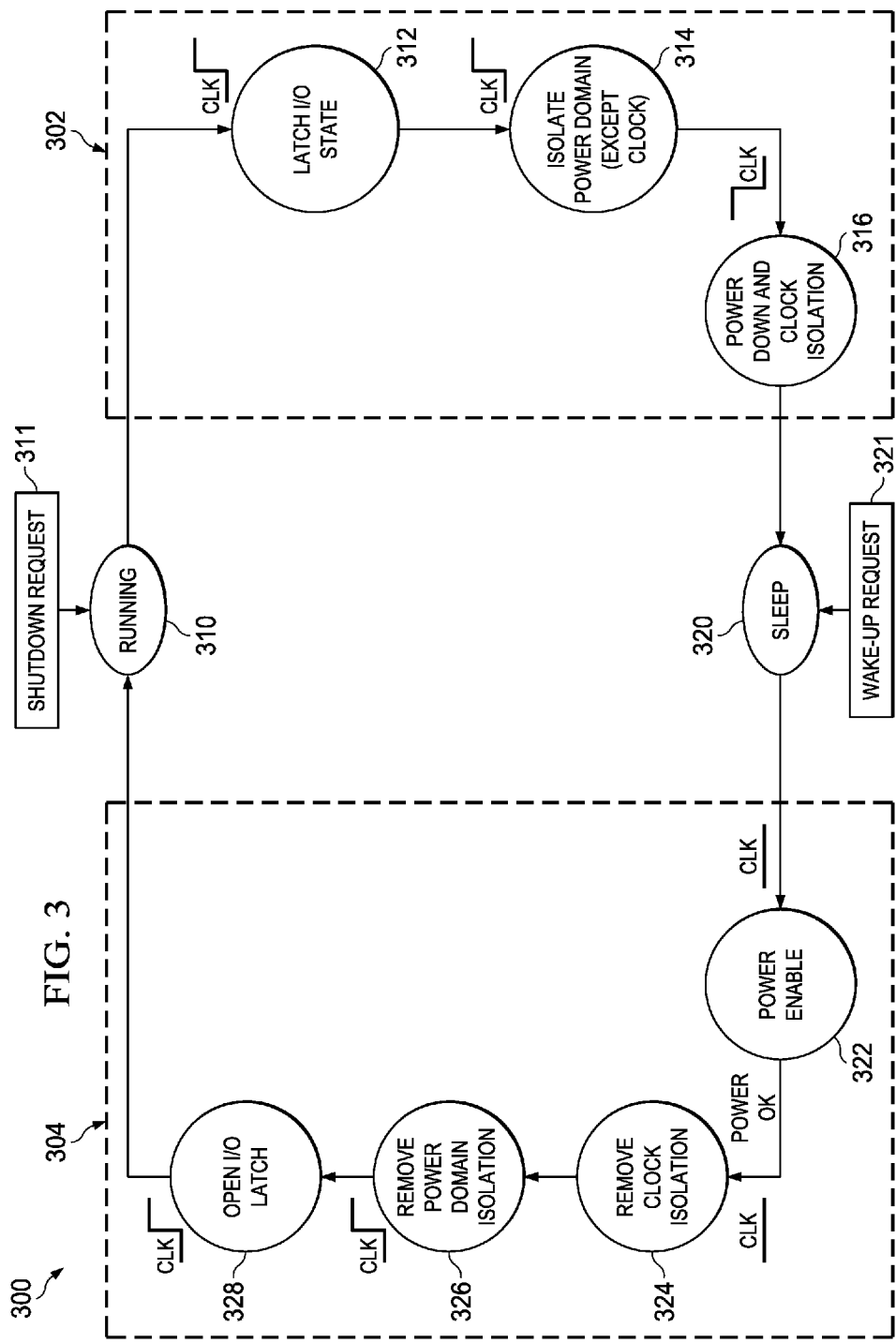
FIG. 3 illustrates in a state diagram the operation of a finite state machine in an embodiment controlling a power managed domain.

FIG. 3 illustrates in a state diagram 300 the operations of a FSM for a power managed domain shutdown and wake-up embodiment. The power managed domain clock CLK is used to clock the FSM. In state diagram 300, two processes are represented: the shutdown process (shown in the dashed line box 302, including states 312, 314, and 316) and the wake-up process (shown in the dashed line box 304 including states 322, 324, 326 and 328). Between the two processes are two stable states, state 310, "Running", at the top of FIG. 3 and state 320, "Sleep", at the bottom of FIG. 3. Beginning with the FSM in the Running state, 310, the FSM transitions to state 312 in response to a shutdown request 311. State 312 is the "Latch I/O state". In some applications, where the I/Os are not critical or otherwise don't need to be retained, the Latch I/O state can be optionally omitted. In state 312, the FSM sends a signal on the rising clock edge (as indicated by the clock waveform CLK shown adjacent to state 312 in FIG. 3) to indicate that the power managed domain is to latch the external inputs and outputs, the PD I/Os, preserving the I/O states. The FSM then transitions to step 314, "Isolate power domain (except Clock)". In step 314, on the rising edge of the clock, the FSM isolates the inputs to the AOD that are driven from the PD, except for the clock input. The FSM then transitions from step 314 to step 316, "Power down and Clock isolation". In state 316, the FSM issues a signal on a falling clock edge to isolate the clock and shut off power to the PD. (In FIG. 3, this falling clock edge is indicated by the falling waveform labeled CLK positioned adjacent to state 316.) In state 316, instead of using the rising edge of CLK, the opposite clock edge (in an example, the falling edge) is used to transition to the state 316 from state 314. The FSM then goes into Sleep mode shown as state 320, however there is no clock transition between state 316 and 320. States 320 and state 316 are identical and are shown separately mainly to distinguish the shutdown and wakeup processes. Use of the falling clock edge to power down the PD ensures that no noise on the clock line inadvertently clocks the AOD circuitry before power is shut off to the PD. When the FSM transitions to sleep state 320, the PD is in shutdown and the clock generator in the PD is in shutdown, so the PD is in the sleep state in 320. Because the clock from the PD is used to clock the FSM, no continuous clock is needed within the AOD to power down the PD. Also, no continuous clock is running during the time the FSM is in the Sleep state 320. Substantial power saving results, as there is no switching power consumed in the AOD during sleep mode.

Continuing to follow the state diagram 300 clockwise from the sleep state 320, the wake up process 304 begins when an asynchronous wake-up request 321 is received in state 320. The asynchronous wake-up request comes from a domain outside of the PD, such as an interrupt from a GPIO, a time out signal, a signal corresponding to a touch at a touch screen sensor or a signal indicating light detected at a light sensitive sensor. Because in the embodiments there is no clock available to the FSM in state 320, the FSM cannot respond synchronously. Instead, a power enable signal is sent asynchronously from the AOD in state 322, "Power Enable", to enable a voltage regulator. The power from the voltage regulator is then provided to the PD and the clock generator in the PD can begin operating. The clock was isolated in the shutdown sequence at state 316 and as the PD powers up in state 322, the clock remains isolated, but now begins toggling. When the FSM receives a "power OK" input in state 322, the FSM transitions to state 324, "Remove clock isolation." This action is also done asynchronously (as indicated by the clock waveform CLK with no edge shown adjacent state 324 in FIG. 3). In state 324, the FSM signals to remove the clock isolation. At this point, the PD clock is now available to the AOD to use as the clock for the FSM. The wake up sequence can now continue in a synchronous fashion. The signal "Wake-up request" is then synchronized with CLK in AOD. The FSM then transitions to the next state, 326, "Remove power domain isolation." In state 326, the FSM signals the AOD to remove power isolation from the general circuitry 326 on a rising clock edge. The FSM then transitions to state 328, and the FSM signals the PD to open the I/O latches on a rising clock edge. Because the clock in the PD clocks the FSM in states 326 and 328, the wake up process completes in a synchronous fashion (as indicated by the clock waveforms adjacent states 326 and 328 in FIG. 3.) The FSM then transitions back to step 310, the Running state. At this point, the FSM again in state 310 where it is ready to re-enter the shutdown process. The PD is now operating normally.

In this example, the rising edge of the clock is shown as the active edge and the opposite edge, or falling edge, is used to isolate the clock and power shut down in step 316. It is also contemplated that the falling clock edge could be the active edge, with the rising edge used in state 316. In that case, the power down and clock isolation signal in state 316 can be sent on the rising edge of the clock.

Figure 4:
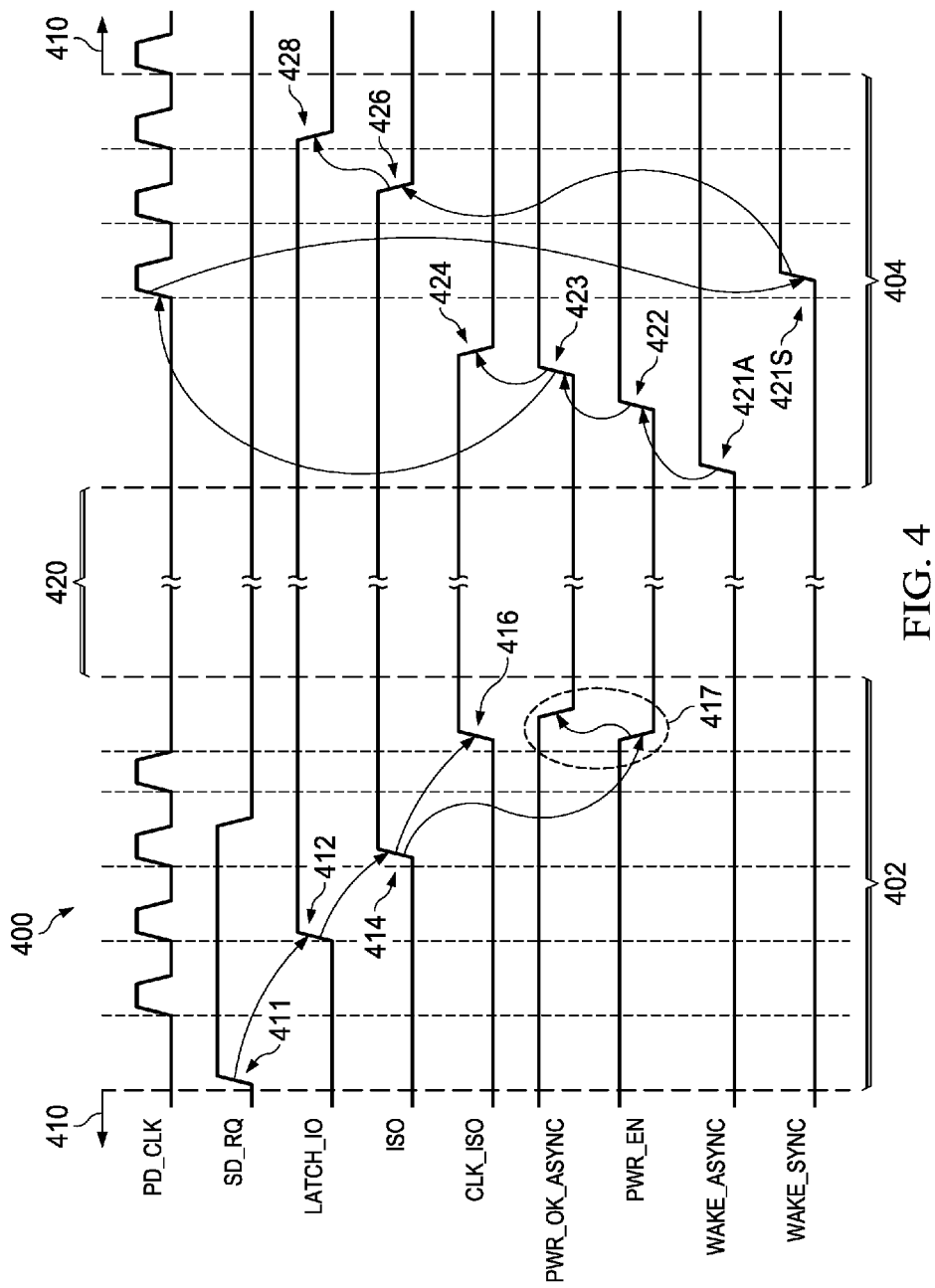
FIG. 4 illustrates in a timing diagram a power managed domain shutdown and wake-up for an embodiment using the clock within the power managed domain.

FIG. 4 illustrates in a timing diagram the operations of a power managed domain shutdown and wake-up embodiment. In the embodiment corresponding to the timing diagram of FIG. 4, the FSM is using the clock within the power managed domain that is being controlled. Timing diagram 400 shows several signals from top to bottom labeled as: PD_CLK (power managed domain clock), SD_RQ (shutdown request), LATCH_IO (latch I/O), ISO (Isolate), CLK_ISO (PD clock isolate), PWR_OK_ASYNC (power OK asynchronous), PWR_EN (power enable), WAKE_ASYNC (wake-up asynchronous) and WAKE_SYNC (wake-up synchronous). All of the signals in FIG. 4 start in the inactive state (low) except PWR_OK_ASYNC and PWR_EN, which start in the active state (high). The timing diagram 400 begins on at the left side of FIG. 4 with the PD in a steady state running condition at time 410 with PD_CLK toggling.

Following the timing diagram 400 from left to right, at time 411 shutdown request SD_RQ goes active (high) asynchronously. Following the next rising edge of PD_CLK, the LATCH_I/O signal goes high at time 412, indicating the PD should latch the I/O pins, preserving the states. At the next following PD_CLK cycle, the ISO signal goes high at time 414. This signal indicates the AOD should isolate all inputs driven from PD except the PD_CLK, in preparation for shutdown. On the falling edge of the next PD_CLK, the CLK_ISO signal goes active at event 416, and the signals PWR_OK_ASYNC and PWR_EN go inactive at event 417. These signals indicate the AOD should isolate the PD_CLK and shut down the power to the domain. With no power, the PD_CLK stops toggling and the PD is in sleep mode indicated as period 420 in FIG. 4. The PD can remain in the sleep state indefinitely, as indicated by the break symbols in the signal traces.

To wake-up the PD from the sleep mode, the WAKE_ASYNC goes active as indicated by the event labelled 421A. Because no clock is toggling in the sleep mode, the PWR_EN signal is asynchronously generated within the AOD at event 422. With the PD powered and running, the PD returns a PWR_OK_ASYNC signal at event 423. The PWR_OK_ASYNC signal indicates that the PD is now powered. Since the power is also enabled to the clock generator in the PD, the PD_CLK also starts toggling. The next action is the CLK_ISO signal that changes asynchronously to inactive at event 424, causing the toggling PD_CLK to no longer be isolated from the AOD. PD_CLK now becomes available to the AOD and the FSM. With the PD_CLK available to the FSM, the WAKE_SYNC signal is synchronously asserted by the FSM at event 4215, following a rising edge on the PD_CLK. The FSM then de-asserts the ISO signal, which is shown going inactive at event 426. As the FSM transitions through the states in the wake up sequence, the LATCH_IO signal is then shown going inactive at event 428. The PD is now running normally as indicated by event 410.

Figure 5:
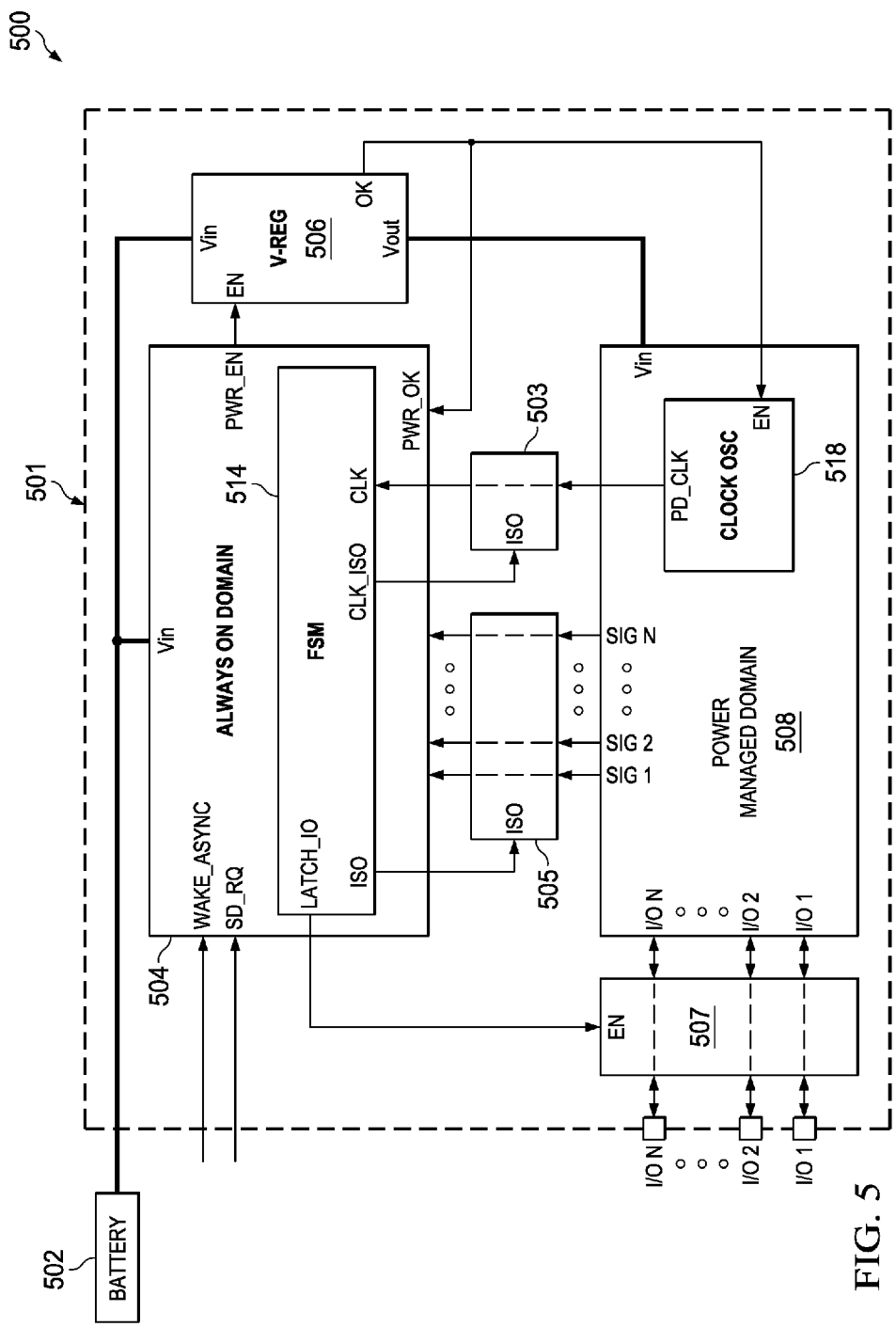
FIG. 5 is a block diagram of an embodiment including an always on domain using a power managed domain clock.

FIG. 5 is a block diagram of an embodiment system 500 or an embodiment integrated circuit 501. Circuit 500 includes an always on domain with a FSM using a clock from a power managed domain. FIG. 500 has seven main blocks: the Battery 502, Always On Domain 504, V-Reg (voltage regulator) 506, Power Managed Domain 508, one latch 507 and two isolation cells 503 and 505. Two subblocks are shown: FSM (finite state machine) 514 resides within AOD 504 and Clock Osc (power managed domain clock oscillator) 518 reside within the PD 508.

In FIG. 5, the blocks 503, 504, 505, 506, 507 and 508 can be implemented as components mounted on a circuit board or module. In another alternative embodiment, the blocks can form part of an integrated circuit 501, as indicated by the dashed line around 501. In further alternative embodiments, the components can be arranged on multiple integrated circuits provided in single package, such as a multi-chip module or a stacked chip package. Battery 502 is external to the system or to the integrated circuit 501.

The Always On Domain block 504 has three asynchronous input terminals: SD_RQ (shutdown request); WAKE_ASYNC (wake-up request); and PWR_OK (power OK). The Always On Domain block 504 has one asynchronous output terminal PWR_EN. The AOD 504 also has a series of signal input terminals coupled to input signals from the powered domain 508 labeled Sig 1, Sig 2 through Sig N. These input signals couple to the AOD 504 through the isolation block 505. The Always On Domain block 504 has a power terminal Vin received from Battery 502.

The FSM block 514 within AOD 504 has three output terminals: LATCH_IO (latch input/outputs), ISO (isolate) and CLK_ISO (clock isolate). The FSM 514 has an input terminal CLK. The voltage regulator V-Reg 506 has a power input terminal Vin, a power output terminal Vout, an enable input terminal EN, and a status output terminal OK. The PD 508 has a power terminal Vin, external input output interface signals I/O 1, I/O 2 through I/O N, and a series of signal terminals Sig 1, Sig 2 through Sig N. The Clock Osc block 518 within the PD has an input terminal EN and an output terminal PD_CLK (power managed domain clock). The isolation cells 505 and 503 each have an ISO input terminal and a series of input terminals with corresponding output terminals (not labeled). The latch 507 has an EN input terminal and series of input output terminals (not labeled for clarity).

In operation, battery 502 powers the Always On Domain 504 and the voltage regulator V-Reg 506 through input terminals Vin. The output signal Vout of voltage regulator V-Reg 506 is coupled to the Power Managed Domain 508 power terminal Vin. The enable EN input of V-Reg 506 couple to the PWR_EN output terminal of the AOD. The status output OK of V-Reg 506 couple to the EN terminal of the Clock Osc 518. The status output OK of V-Reg couples to the PWR_OK terminal of AOD 504. The two AOD inputs WAKE_ASYNC (wake-up asynchronous) and SD_RQ (shutdown request) are low frequency signals compared to the frequency of the clock signal PD_CLK and are provided by other aspects of the system (not shown) such as a touch screen interrupt, or at the expiration of an inactivity timer. The LATCH_I/O terminal of the FSM 514 is coupled to the EN terminal of latch 507. The ISO terminal of FSM 514 is coupled to the ISO terminal of isolation cell 505. The CLK_ISO terminal of FM 514 is coupled to the ISO of isolation cell 503. The PD_CLK terminal of Clock Osc 518 is coupled to an input of isolation cell 503 and the corresponding output is coupled to the FSM 514 terminal CLK. The series of terminals Sig 1, Sig 2 through Sig N of PD 508 couple to the input terminals of isolation cell 505. The corresponding output terminals of isolation cell 505 are coupled to the Always On Domain 504. The series of input and output terminals I/O 1, I/O 2 through I/O N of PD 508 are coupled to latch 507. The corresponding input output terminals of latch 507 are coupled to external features of system like a touch screen controller, display, etc.

When the system shown in the block diagram 500 is in a steady state, such as the running state illustrated as 410 at the beginning of the timing diagram 400 in FIG. 4, the PD_CLK is active and toggling and being used by the AOD and the FSM 514 within 504. Battery power is supplied to the Power Managed Domain via the V-Reg 506, and the PWR_OK signal is active high.

When a shutdown request arises from some aspect of the system outside of the PD and the AOD, the shutdown request signal SD_RQ is received by the Always On Domain 504. In response to the signal SD_RQ, FSM 514 begins the shutdown process. FSM 514 first asserts the signal LATCH_ISO to enable latch 507, latching external I/O interface signals I/O 1, I/O 2 through I/O N. At the following PD_CLK edge, FSM 514 outputs the ISO signal. The ISO signal is used to isolate the Always On Domain 504 inputs that are driven from Power Managed Domain 508, except for the CLK input. Next, the signal CLK_ISO is asserted by FSM 514 at a falling edge of the clock signal CLK, causing isolation cell 503 to isolate the PD_CLK signal from the FSM 514. At the same time, on the falling edge of the CLK input to the AOD, the PWR_EN signal from the Always on domain 514 is disabled, causing the power to the PD 508 and to the Clock Osc 518 to be shut down by the V-Reg block 506. At this point, the PD 508 is in shutdown mode. The Always On Domain 504 is still powered, although without any internal clock toggling.

When a wake-up event arises from some aspect of the system, such as a touch on a touch screen, the WAKE_ASYNC signal is asserted to AOD 504. In response to the WAKE_ASYNC signal, the signal PWR_EN is asynchronously asserted by the AOD 504, causing the block V-Reg 506 to supply power to the PD 508 at the Vin terminal. Once power is active, V-Reg 506 activates the status signal OK. The OK signal is coupled to the clock oscillator block 518 within the power managed domain PD 508, enabling the PD_CLK signal to begin toggling. The Always On Domain 504 will also receive the PWR_OK signal (also coupled to the OK signal of V-Reg 506) and will respond by disabling the CLK_ISO signal.

Isolation cell 503 disables isolation in response to the de-assertion of the CLK_ISO signal from 504, now permitting the clock oscillator 518 to output clock signals PD_CLK to the CLK input of the FSM 514. On the availability of a signal at the CLK input, the WAKE_SYNC signal (not shown in FIG. 5 but shown in FIG. 4) within the AOD 504 is asserted on the active edge of CLK. On the following CLK edge, the FSM 514 disables the ISO signal to isolation cell 505, enabling the signals Sig 1, Sig 2 through Sig N to operate. On a following clock edge, the FSM disables the LATCH_I/O signal to latch 507, enabling the external interface signals I/O 1, I/O 2 through I/O N to operate. With the disabling of the LATCH_I/O signal, the wake up process is complete, and the PD is fully powered and in the running state.

In FIG. 5, the example block diagram 500 shows a single Power Managed Domain 508 and a single FSM 514, however in additional embodiments multiple power managed domains can be managed by a single FSM. In alternative embodiments, multiple power managed domains could be managed by more than one FSM. The power managed domain 508 can include any additional circuitry or functionality that can be powered down to save power, such as: microcontrollers, microprocessors, signal processors, memory, logic functions, analog to digital converters, transceiver circuits. The power managed domain 508 can be divided into more than one power managed domain that can be powered down and powered up separately.

Figure 6:
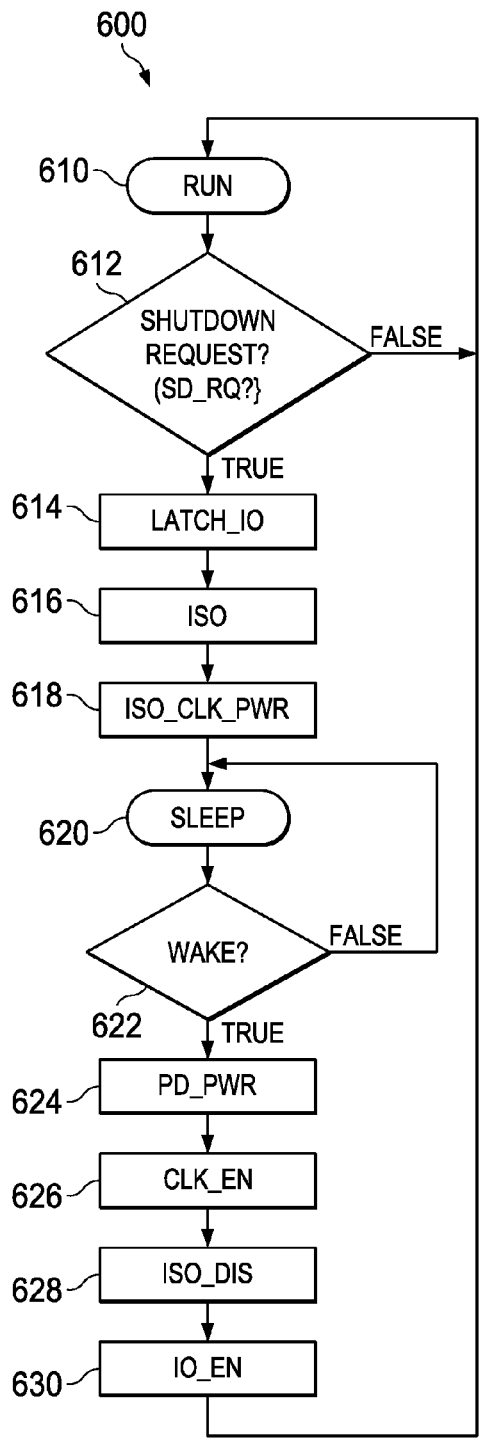
FIG. 6 is a flow diagram of a method embodiment for operating an always on domain to control a power managed domain.

FIG. 6 is a flow diagram 600 illustrating steps of an embodiment method for operating an always on domain using a power managed domain clock to clock the finite state machine.

In FIG. 6, a plurality of steps are shown arranged top to bottom and are shown performed sequentially, including: RUN (Running state) 610; shutdown request (SD_RQ) 612; LATCH_IO 614 (latch external I/O state); ISO 616 (isolate AOD inputs driven from PD); ISO_CLK_PWR 618 (isolate PD clock and disable power); SLEEP 620 (sleep state); WAKE 622 (PD wake-up request); PD_PWR 624 (PD power on); CLK_EN 626 (un-isolate PD clock); ISO_DIS 628 (un-isolate AOD inputs driven from PD; and IO_EN 630 (enable external I/O interface).

The order of steps shown in FIG. 6 is merely illustrative of a particular example. In alternative arrangements, one or more of the steps in FIG. 6 can be performed in a different order. Some steps can be combined. One or more of the steps shown can also be performed as two steps instead of one. For example, if a particular system requires it, the shutdown request signal SD_RQ can be synchronized to the AOD clock in the AOD before a shutdown process is started. In an alternative approach, the LATCH_IO state can be removed if a particular system does not require retaining the I/O state of PD before a shutdown.

In FIG. 6, the method begins at step 610, RUN. From step 610, the method loops between step 610 and the next step, 612, until a shutdown request SD_RQ is received. When a shutdown request is received and the condition in step 612 is true, the method transitions to step 614, the latch IO (LATCH_IO) step, where all external interface signals from the PD are retained. In the next step, 616, the isolate (ISO) step, all AOD signals driven from the PD to the AOD are isolated. In the next step 618, labeled ISO_CLK_PWR, the method isolates the PD clock, and shuts down the power to the PD. The method then transitions to the next step, SLEEP 620, where the PD and the FSM is fully in the shutdown mode. The method continues transitioning between the SLEEP state 620 and the next step 622, WAKE?, until a wake request arrives. Because the clock generation circuitry is within the power managed domain, the wake request signal is asynchronous with respect to the PD clock. Once the wake request arrives, processing asynchronously moves to state 624, labeled PD_PWR, where the PD power is restored. Once power is restored to the voltage regulator, the PD clock begins to toggle, although it is still isolated from the PD and from the FSM. In the following step 626, labeled CLK_EN, the PD clock is enabled for the PD as well as for the AOD. In the following step 628, labeled ISO_DIS, the AOD inputs from PD are un-isolated. In following step 630, labeled IO_EN, the external interface from the PD is enabled. The method then transitions back to step 610, the RUN step, and the PD is back in the running state.

Use of the embodiments provides low power consumption of a power managed domain and an always on domain that exceed the results achieved using prior approaches. In the embodiments, a finite state machine manages a power managed domain and performs a sleep or shutdown mode while being clocked by a clock from the power managed domain. In the embodiments, after a shutdown, the clock is stopped to the always on domain and to the power managed domain. By using the clock from the power managed domain, and by stopping the clock during the shutdown mode, the embodiments achieve very low power consumption while still having a fast wake up sequence.

In an example embodiment, an apparatus includes: a voltage regulator that outputs a voltage responsive to an enable signal; a power managed domain coupled to the voltage from the voltage regulator and including a clock generator configured to output a clock signal; and an always on domain coupled to receive the clock signal from the power managed domain. The always on domain further includes a finite state machine coupled to receive the clock signal and to receive a shutdown request signal, configured to output a signal to the voltage regulator to control the power to the power managed domain and to disable the clock generator, responsive to the shutdown request signal. The apparatus further includes an asynchronous wake input configured to receive an asynchronous wake signal, and circuitry in the always on domain configured to enable power to the power managed domain, responsive to the asynchronous wake signal.

In a further example, in the apparatus, the finite state machine is coupled to the clock signal from the power managed domain. In still another example, in the apparatus, the finite state machine is configured to disable the clock generator on a falling edge clock signal. In yet another example, in the apparatus, the finite state machine further includes a clock isolation circuit coupled between the clock generator and the finite state machine. In another alternative example, the clock isolation circuit is configured to isolate the clock signal from the finite state machine in response to an isolation signal from the finite state machine.

In yet another example, the apparatus further includes input and output latches coupled to store input and output signals to and from the power managed domain, responsive to a latch input and output signal from the finite state machine.

In another alternative example, the apparatus further includes the always on domain configured to enable the voltage regulator responsive to the asynchronous wake signal. In yet another example, in the apparatus, the power managed domain further includes a processor. In still a further alternative example, in the apparatus, the power managed domain further includes a digital signal processor. In still a further alternative example, in the apparatus, the power managed domain further includes memory devices configured to store program instructions.

In yet another example embodiment, an integrated circuit includes: a power managed domain including circuitry that can be powered down in a shutdown mode, the power managed domain including a clock generator configured to output a clock signal; and an always on domain including a finite state machine clocked by the clock signal and configured to output signals to power down the power managed domain, responsive to a shutdown request signal.

In another example, the integrated circuit further includes a voltage regulator configured to output a voltage supply to the power managed domain responsive to a power enable signal from the always on domain. In yet another example the integrated circuit further includes the finite state machine configured to output the power enable signal that disables the voltage regulator, responsive to the shutdown request signal.

In an alternative example, the finite state machine is configured to disable the clock generator, responsive to the shutdown signal. In still another example, the integrated circuit includes the always on domain configured to asynchronously enable the voltage regulator responsive to an asynchronous wake signal input to the always on domain.

In a further example, the integrated circuit includes the finite state machine configured to enable the clock generator, responsive to the asynchronous wake signal.

In yet another example embodiment, a method includes receiving a shutdown request signal in an always on domain that is clocked by a clock signal from a power managed domain; outputting an input output isolation signal to the power managed domain, responsive to the shutdown request signal; and outputting signals to isolate the clock and to shutdown the power to the powered domain, responsive to the shutdown request signal.

In still another example, the method further includes: receiving an asynchronous wake signal in the always on domain; asynchronously enabling the power to the power managed domain in response to the asynchronous wake signal; and asynchronously enabling a clock generator in the power managed domain in response to the asynchronous wake signal.

In a further example, the method further includes: in response to the shutdown request signal in the always on domain, outputting an input-output latch control signal to the power managed domain.

In still another example, in the method, the always on domain includes a finite state machine operated synchronously with the clock generated by the power managed domain.

Modifications are possible in the described embodiments, and other embodiments are possible within the scope of the claims.

What is claimed is:

1. An apparatus, comprising:
    a voltage regulator configured to output a voltage responsive to a first logic state of a power enable signal;
    a power managed domain coupled to the voltage regulator and including a clock generator configured to output a clock signal in response to a clock enable signal;
    an always on domain including a finite state machine coupled to receive the clock signal from the power managed domain, the always on domain coupled to receive a shutdown request signal and an asynchronous wake signal and configured to operate asynchronously when the clock signal is inactive; and
    circuitry in the always on domain configured to produce the first logic state of the power enable signal to enable power to the power managed domain, responsive to the asynchronous wake signal.

2. The apparatus of claim 1, comprising circuitry in the always on domain configured to produce a second logic state of the power enable signal to disable power to the power managed domain and the clock generator, responsive to the shutdown request signal.

3. The apparatus of claim 1, in which the finite state machine is configured to isolate the clock generator from the finite state machine on a falling edge of the clock signal.

4. The apparatus of claim 1 and further including a clock isolation circuit coupled between the clock generator and the finite state machine.

5. The apparatus of claim 4, in which the clock isolation circuit is configured to isolate the clock signal from the finite state machine in response to an isolation signal from the finite state machine.

6. The apparatus of claim 1, and further including input and output latches coupled to store input signals and output signals to and from the power managed domain, responsive to a latch input and output signal from the finite state machine.

7. The apparatus of claim 1, in which the finite state machine is configured to asynchronously couple the clock generator to the finite state machine in response to the stable voltage from the voltage regulator.

8. The apparatus of claim 1, in which the power managed domain further includes a processor.

9. The apparatus of claim 1, in which the power managed domain further includes a digital signal processor.

10. The apparatus of claim 1, in which the power managed domain further includes memory devices configured to store program instructions.

11. An integrated circuit, comprising:
    a power managed domain including a clock generator configured to output a clock signal; and
    an always on domain including a finite state machine coupled to receive the clock signal and configured to operate asynchronously when the clock signal is inactive,
    wherein the always on domain is configured to produce a first logic state of a power enable signal to power up the power managed domain, responsive to an asynchronous wake signal, and to produce a second logic state of the power enable signal to power down the power managed domain responsive to a shutdown request signal.

12. The integrated circuit of claim 11, and further including a voltage regulator configured to output a voltage to the power managed domain responsive to the first logic state of the power enable signal from the always on domain.

13. The integrated circuit of claim 12, in which the always on domain is configured to output the second logic state of the power enable signal to disable the voltage regulator, responsive to the shutdown request signal.

14. The integrated circuit of claim 11, in which the finite state machine is configured to output a signal to isolate the clock generator from the finite state machine, responsive to the shutdown request signal.

15. The integrated circuit of claim 12, in which the always on domain is configured to asynchronously produce the first logic state of the power enable signal to enable the voltage regulator responsive to receiving the asynchronous wake signal.

16. The integrated circuit of claim 11, in which the finite state machine is configured to produce a signal to couple the clock generator to the finite state machine, responsive to the asynchronous wake signal.

17. A method, comprising:
  receiving a shutdown request signal in an always on domain that is clocked by a clock signal from a power managed domain;
  producing a first logic state of a first isolation signal to isolate the power managed domain responsive to the shutdown request signal;
  producing a second isolation signal to isolate the clock signal of the power managed domain, responsive to the shutdown signal request;
  shutting down the power to the power managed domain, responsive to the shutdown request signal; and
  operating the always on domain asynchronously when the clock signal is inactive.

18. The method of claim 17, and further including:
  receiving an asynchronous wake signal by the always on domain;
  asynchronously enabling power to the power managed domain in response to the asynchronous wake signal; and
  asynchronously enabling a clock generator in the power managed domain in response to the asynchronous wake signal.

19. The method of claim 17, comprising producing a second logic state of the first isolation signal in response to an asynchronous wake signal.

20. The method of claim 17, in which the always on domain includes a finite state machine operated synchronously with the clock signal generated by the power managed domain.

* * * * *